United States Patent
Shikauchi et al.

(10) Patent No.: US 10,586,701 B2
(45) Date of Patent: Mar. 10, 2020

(54) SEMICONDUCTOR BASE HAVING A COMPOSITION GRADED BUFFER LAYER STACK

(71) Applicants: SANKEN ELECTRIC CO., LTD., Niiza-shi, Saitama (JP); SHIN-ETSU HANDOTAI CO., LTD., Tokyo (JP)

(72) Inventors: Hiroshi Shikauchi, Niiza (JP); Ken Sato, Miyoshi-machi (JP); Masaru Shinomiya, Annaka (JP); Keitaro Tsuchiya, Takasaki (JP); Kazunori Hagimoto, Takasaki (JP)

(73) Assignees: SANKEN ELECTRIC CO., LTD., Niiza (JP); SHIN-ETSU HANDOTAI CO., LTD., Tokyo (JP)

( * ) Notice: Subject to any disclaimer, the term of this patent is extended or adjusted under 35 U.S.C. 154(b) by 55 days.

(21) Appl. No.: 16/077,263

(22) PCT Filed: Feb. 26, 2016

(86) PCT No.: PCT/JP2016/001060
§ 371 (c)(1),
(2) Date: Aug. 10, 2018

(87) PCT Pub. No.: WO2017/145199
PCT Pub. Date: Aug. 31, 2017

(65) Prior Publication Data
US 2019/0051515 A1  Feb. 14, 2019

(51) Int. Cl.
*H01L 29/10* (2006.01)
*H01L 29/20* (2006.01)
(Continued)

(52) U.S. Cl.
CPC ...... *H01L 21/0251* (2013.01); *H01L 21/0254* (2013.01); *H01L 21/02381* (2013.01);
(Continued)

(58) Field of Classification Search
CPC .............. H01L 29/1075; H01L 29/205; H01L 29/7786
See application file for complete search history.

(56) References Cited

U.S. PATENT DOCUMENTS 5,847,409 A * 12/1998 Nakayama ............ H01L 29/155
257/15
7,599,593 B2 * 10/2009 Harris, Jr. .............. B82Y 20/00
257/19
(Continued)

FOREIGN PATENT DOCUMENTS

JP    2005-158889 A    6/2005
JP    2007-221001 A    8/2007
(Continued)

OTHER PUBLICATIONS

May 17, 2016 International Search Report issued in International Patent Application No. PCT/JP2016/001060.

*Primary Examiner* — Ida M Soward
(74) *Attorney, Agent, or Firm* — Oliff PLC (57) ABSTRACT

Semiconductor base including: silicon-based substrate; buffer layer including first and second layers alternately on silicon-based substrate, first layer made of nitride-based compound semiconductor containing first material, second layer made of nitride-based compound semiconductor containing second material having larger lattice constant than first material; channel layer on buffer layer and made of nitride-based compound semiconductor containing second material, buffer layer has: first composition graded layer between at least one of first layers and second layer immediately thereabove, made of nitride-based compound semiconductor whose composition ratio of second material is increased gradually upward, whose composition ratio of first material is decreased gradually upward; second composition graded layer between at least one of second layers and first layer immediately thereabove, made of nitride-based com- (Continued)

pound semiconductor whose first material is increased gradually upward, whose composition ratio of second material is decreased gradually upward, first composition graded layer is thicker than second composition graded layer.

19 Claims, 7 Drawing Sheets (51) Int. Cl.
    *H01L 29/778* (2006.01)
    *H01L 21/02* (2006.01)
    *H01L 29/205* (2006.01)
    *H01L 29/66* (2006.01)

(52) U.S. Cl.
    CPC .. *H01L 21/02458* (2013.01); *H01L 21/02507* (2013.01); *H01L 29/1075* (2013.01); *H01L 29/205* (2013.01); *H01L 29/7786* (2013.01); *H01L 29/2003* (2013.01); *H01L 29/66462* (2013.01); *H01L 29/7787* (2013.01)

(56) References Cited

U.S. PATENT DOCUMENTS

| | | | |
|---|---|---|---|
| 7,732,823 B2* | 6/2010 | Kawaguchi | B82Y 10/00 257/12 |
| 7,868,318 B2* | 1/2011 | Hudait | H01L 29/205 257/19 |
| 7,998,835 B2* | 8/2011 | Teo | H01L 21/76254 257/E21.211 |
| 8,101,971 B2* | 1/2012 | Dutta | H01L 27/14634 257/184 |
| 8,115,235 B2* | 2/2012 | Pillarisetty | B82Y 10/00 257/194 |
| 8,344,356 B2* | 1/2013 | Sakamoto | H01L 21/02381 257/22 |
| 8,742,396 B2* | 6/2014 | Ooshika | H01L 29/15 257/15 |
| 8,946,723 B2* | 2/2015 | Miyoshi | C30B 25/183 257/190 |
| 9,543,469 B2* | 1/2017 | Iwata | H01L 33/12 |
| 9,653,642 B1* | 5/2017 | Raring | H01L 27/0605 |
| 9,660,068 B2* | 5/2017 | Inoue | H01L 29/66462 |
| 2005/0110043 A1 | 5/2005 | Otsuka et al. | |
| 2010/0244096 A1 | 9/2010 | Sato | |
| 2012/0153440 A1* | 6/2012 | Ikuta | H01L 21/187 257/615 |
| 2013/0307023 A1 | 11/2013 | Kokawa et al. | |
| 2014/0353587 A1* | 12/2014 | Hoteida | H01L 21/02381 257/22 |
| 2014/0361337 A1* | 12/2014 | Sugiyama | H01L 21/02458 257/190 |
| 2016/0042946 A1* | 2/2016 | Keller | H01L 21/0237 438/478 |
| 2016/0118488 A1* | 4/2016 | Nagahisa | H01L 29/7786 257/76 |
| 2017/0229549 A1* | 8/2017 | Derluyn | H01L 21/02381 |

FOREIGN PATENT DOCUMENTS

| | | |
|---|---|---|
| JP | 2010-232293 A | 10/2010 |
| JP | 2012-243871 A | 12/2012 |

* cited by examiner

SEMICONDUCTOR BASE HAVING A COMPOSITION GRADED BUFFER LAYER STACK

TECHNICAL FIELD

The present invention relates to a semiconductor base and a semiconductor device.

BACKGROUND ART

Generally, a nitride semiconductor layer is formed on an inexpensive silicon substrate or sapphire substrate. However, lattice constants of these substrates are greatly different from that of the nitride semiconductor layer, and thermal expansion coefficients are also different therebetween. Thus, considerable strain energy is produced in the nitride semiconductor layer formed on the substrate by epitaxial growth. As a result, the nitride semiconductor layer tends to suffer from crack formation or a reduction in crystal quality.

To solve the problem, as a conventional practice, a buffer layer in which nitride semiconductor layers with different compositions are stacked is arranged between a substrate and a functional layer made of a nitride semiconductor.

Moreover, as disclosed in Patent Documents 1 to 3 and so forth, a GaN-on-Si-based semiconductor is provided with composition graded layers between layers in a GaN-based multilayer buffer layer so as to control stress, suppress cracks, and improve crystallinity.

CITATION LIST

Patent Literatures

Patent Document 1: Japanese Unexamined Patent Publication (Kokai) No. 2005-158889
Patent Document 2: Japanese Unexamined Patent Publication (Kokai) No. 2007-221001
Patent Document 3: Japanese Unexamined Patent Publication (Kokai) No. 2010-232293

DISCLOSURE OF INVENTION

Problem to be Solved by the Invention

However, in the case with composition graded layers provided between layers, there is a problem that the growth time is long in comparison with a case without the composition graded layers. In addition, experiments to be described layer have revealed that, in the case where composition graded layers are present between layers, if the degrees of the lattice constant changed in the composition graded layers are larger than 0.7%/nm (i.e., the composition graded layers are thin), the crystallinity deteriorates, and long cracks are formed, decreasing the wafer yield and device yield resulting from fabrication using such a wafer. Conceivably, these are greatly influenced by the composition graded layers provided between a layer having a larger lattice constant and a layer having a smaller lattice constant grown thereon. Hence, it has been found that if the degrees of the lattice constant changed in the composition graded layers are set larger than 0.7%/nm so as to shorten the time for growing the composition graded layers, the structure of Patent Document 2 (i.e., multilayer buffer layer structure in which a composition graded layer is provided between a GaN layer and an AlN layer) is not applicable. This influence is more conspicuous when a GaN layer having a large thickness is grown as an active layer on a buffer layer.

The present invention has been made in view of the above problems. An object of the present invention is to provide a semiconductor base and a semiconductor device which are capable of suppressing crystallinity deterioration and crack elongation even when composition graded layers having degrees of the lattice constant changed larger than 0.7%/nm are provided between layers in a multilayer buffer layer.

Means for Solving Problem

To achieve the object, the present invention provides a semiconductor base comprising: a silicon-based substrate; a buffer layer comprising layers including first layers and second layers alternately provided on the silicon-based substrate, the first layers being made of a nitride-based compound semiconductor containing a first material, and the second layers being made of a nitride-based compound semiconductor containing a second material having a larger lattice constant than the first material; and a channel layer provided on the buffer layer and made of a nitride-based compound semiconductor containing the second material, wherein the buffer layer further comprises: a first composition graded layer which is provided between at least one of the first layers and the second layer immediately thereabove, and which is made of a nitride-based compound semiconductor whose composition ratio of the second material is increased gradually upward and whose composition ratio of the first material is decreased gradually upward; and a second composition graded layer which is provided between at least one of the second layers and the first layer immediately thereabove, and which is made of a nitride-based compound semiconductor whose composition ratio of the first material is increased gradually upward and whose composition ratio of the second material is decreased gradually upward, and the first composition graded layer is ticker than the second composition graded layer, In this manner, forming the first composition grad ed layer thicker than the second composition graded layer makes it possible to apply a compressive stress to the channel layer provided on the buffer layer. Thereby, crystal defect in the channel layer can he reduced. Moreover, even when composition graded layers having degrees of the lattice constant changed larger than 0.7%/nm are provided, crystallnity deterioration and crack elongation can he suppressed.

In this event, average of composition rates of change in relation to a thickness of the first composition graded layer is preferably smaller than average of composition rates of change in relation to a thickness of the second composition graded layer.

With such a relation satisfied between the average of the composition rates of change in the first composition graded layer and the average of the composition rates of change in the second composition graded layer, it is possible to effectively suppress crystallinity deterioration and crack elongation.

In this event, preferably, the first composition graded layer is present between every pair of the first layer and the second layer immediately thereabove, and the second composition graded layer is present between every pair of the second layer and the first layer immediately thereabove.

Providing the First composition graded layers and the second composition graded layers between all the pairs as described above makes it possible to surely suppress crystallinity deterioration and crack elongation.

In this event, preferably, the first composition graded layer is provided as an uppermost layer in the buffer layer, and the first layer is provided under the first composition graded layer.

Constituting the upper portion of the buffer layer in this manner makes it possible to more effectively suppress crystallinity deterioration and crack elongation.

In this event, the first material and the second material can be selected from the group consisting of B, Al, Ga, and In.

As the first material and the second material, those listed above can be suitably used.

In this event, the first layer can be an AlN layer, and the second layer can be a GaN layer.

As the first and second layers constituting the buffer layer, those listed above can be particularly suitably used.

In this event, an average of composition rates of change of the first material in the first and second composition graded layers is preferably larger than 29%/nm but not larger than 75%/nm.

When the average of composition rates of change of the first material in the first and second composition graded layers is larger than 29%/nm, it is possible to form the first and second composition graded layers having smaller thickness, and accordingly shorten the film formation time for the first and second composition graded layers, so that the manufacturing time can be shortened.

Moreover, when the average of composition rates of change of the first material in the first and second composition graded layers is not larger than 75%/nm, it is possible to maintain the effect of suppressing crystallinity deterioration and crack elongation.

In addition, the present invention provides a semiconductor device comprising an electrode on the above-described semiconductor base.

Such a semiconductor device can be a semiconductor device having less crystallinity deterioration and less crack elongation in the channel layer, making it possible to improve the yield and properties of the semiconductor device.

Effects of the Invention

As described above, the semiconductor base according to the present invention makes it possible to suppress crystallinity deterioration and crack elongation even when the composition graded layers having degrees of the lattice constant changed larger than 0. 7%/nm are provided between the layers in the multilayer buffer layer. This makes it possible to shorten the growth time, and thus the cost can be reduced. Moreover, the semiconductor device according to the present invention can be a semiconductor device having less crystallinity deterioration and less crack elongation in the channel layer. This makes it possible to improve the yield and properties of the semiconductor device.

BEST MODES FOR CARRYING OUT THE INVENTION

Hereinafter, one embodiment of the present invention will be described in detail with reference to the drawings. However, the present invention is not limited thereto.

As described above, a buffer layer in which nitride semiconductor layers with different compositions are stacked is arranged between a substrate and a functional layer made of a nitride semiconductor as a conventional practice. Meanwhile, composition graded layers are also provided between layers in a multilayer buffer layer so as to control stress, suppress cracks, and improve crystallinity.

However, in the case with composition graded layers provided between layers, a problem arises that the growth time is long in comparison with a case without the composition graded layers.

Hence, to shorten the growth time of the composition graded layers as much as possible, the present inventors have studied forming a thin. composition graded layer by increasing the degree of the lattice constant changed in the composition graded layer.

Figure 5:
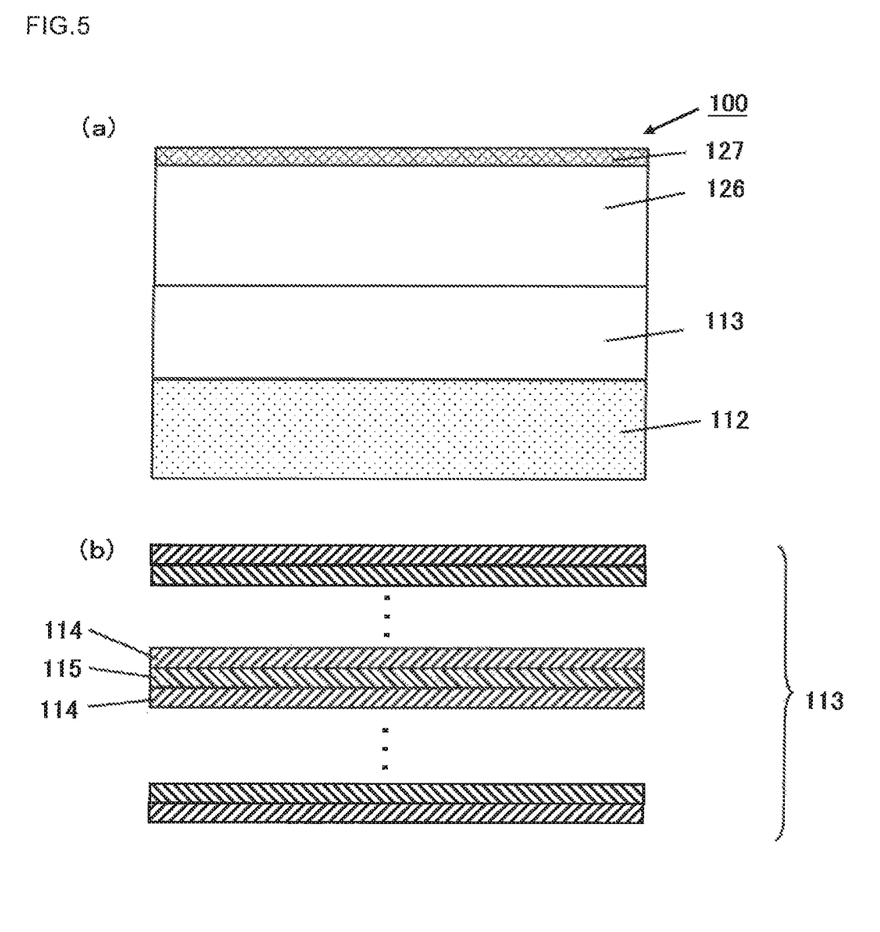
FIG. 5 is a schematic cross-sectional view of semiconductor base of Experimental Example 1.

First, as Experimental Example 1, three semiconductor bases 100 were fabricated in each of which no composition graded layer was provided between layers in a multilayer buffer layer as shown in FIG. 5. Note that the semiconductor base 100 includes: a substrate 112 made of single crystal silicon; a buffer layer 113 provided on the substrate 112; a channel layer 126 provided on The buffer layer 113 and made of GaN; and a barrier layer. 127 provided on the channel layer 126 and made of AlGaN (see FIG. 5(a)). The buffer layer 113 has such a structure that AlN layers 114 and GaN layers 115 are alternately stacked (see FIG. 5(b)).

Note that The AlN layers 114 correspond to the above-described first layers and the GaN layers 115 correspond to the above-described second layers.

Using the semiconductor bases 100 fabricated in. Experimental Example 1, the crystallinity of the GaN layer (channel layer) in a 0002 direction was measured by employing x--ray diffraction. Moreover, surfaces of the semiconductor bases 100 of Experimental Example 1 were observed to measure the crack length. Table 1 shows the results.

Figure 6:
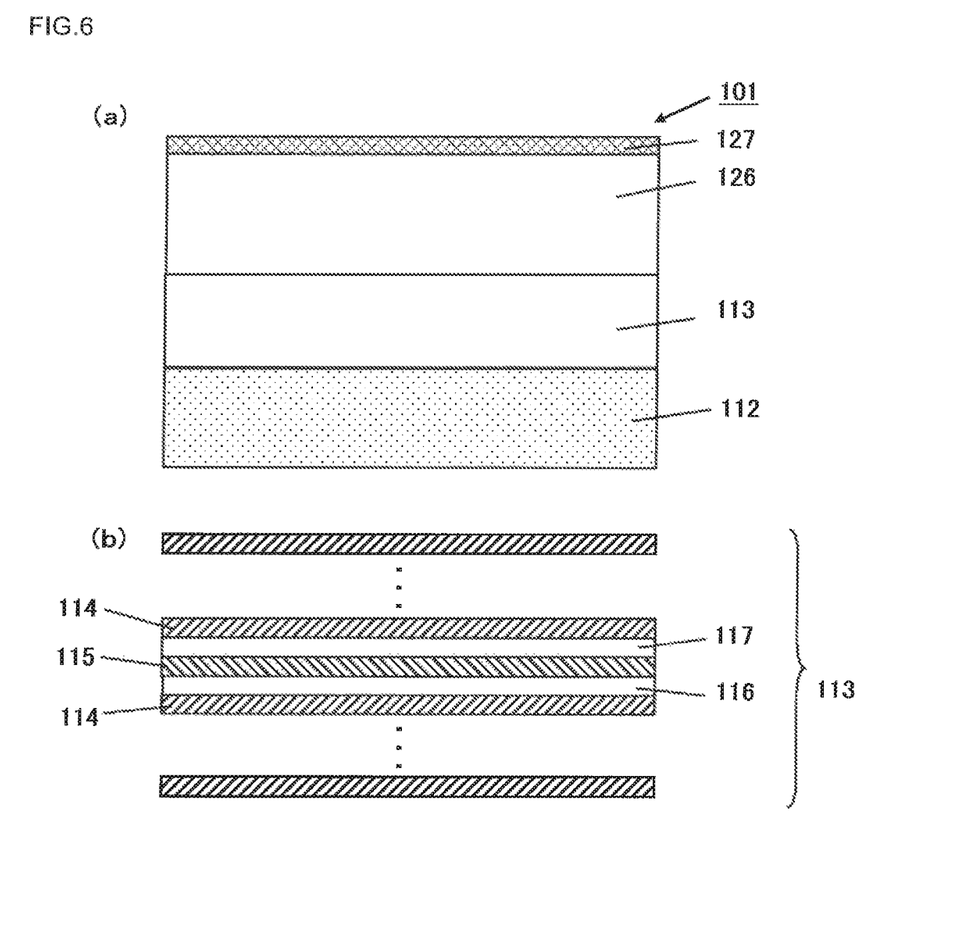
FIG. 6 is a schematic cross-sectional view of a semiconductor base of Experimental Example 2.

Next, as Experimental Example 2, three semiconductor bases 101 were fabricated in each of which composition graded layers were provided between layers in a multilayer buffer layer as shown in FIG. 6. Note that the semiconductor base 101 of Experimental Example 2 has substantially the same configuration as that of the semiconductor base 100 of Experimental Example 1, but is different from the semiconductor base 100 of Experimental Example 1 in that: a first composition graded layer 116 is provided between the AlN layer 114 and the GaN layer 115 immediately thereabove; and a second composition graded layer 117 is provided between the GaN layer 115 and the AlN layer 114 immediately thereabove (see FIG. 6(b)). Here, the first composition graded layer 116 contains Al and Ga, which has a larger lattice constant than Al, such that the composition ratio of Al is decreased gradually upward, and the composition ratio of Ga is increased gradually upward. Moreover, the second composition graded layer 117 contains Al and Ga such that the composition ratio of Al is increased gradually upward, and the composition ratio of Ga is decreased gradually upward. The first composition graded layer 116 and the second composition graded layer 117 have the same thickness, and the degrees of the lattice constant changed were both 0.88%/nm. and hence larger than 0.7%/nm.

Using the semiconductor bases 101 fabricated in Experimental Example 2, the crystallinity and crack length were measured as in Experimental Example 1. Table 1 shows the results.

Figure 7:
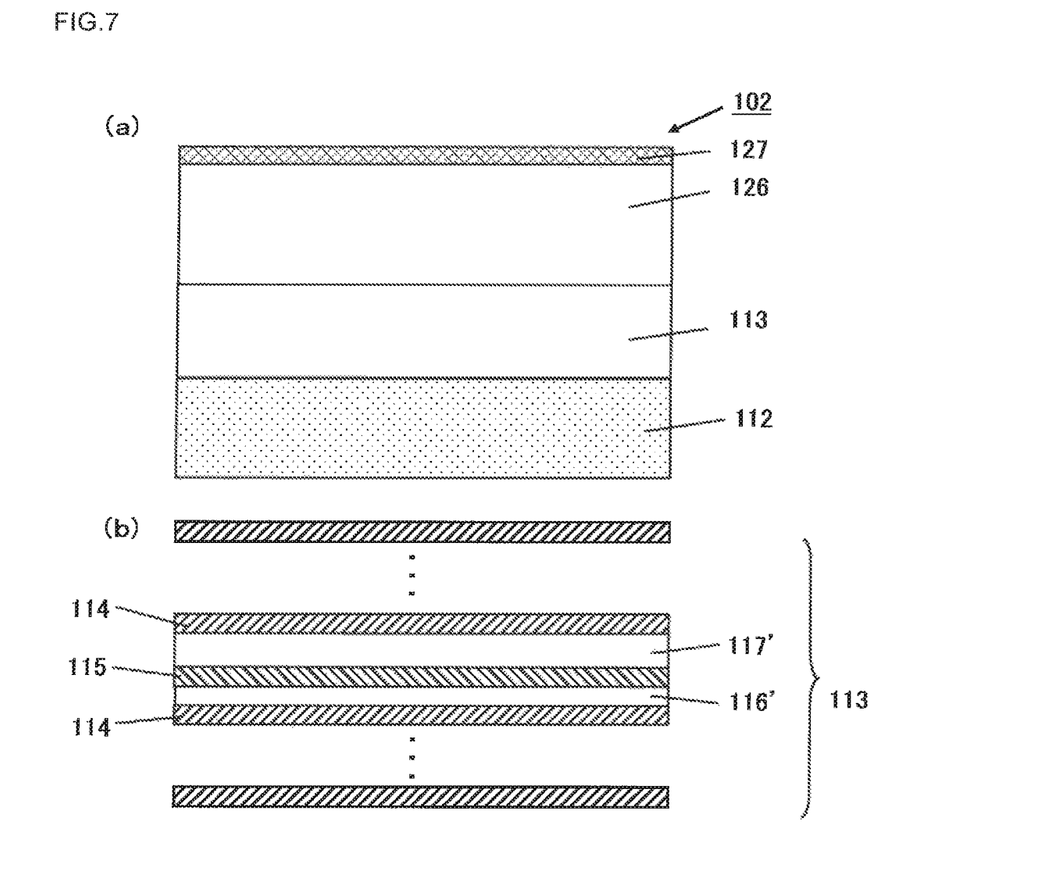
FIG. 7 is a schematic cross-sectional view of a semiconductor base of Experimental Example 3.

Next, as Experimental Example 3, three semiconductor bases 102 were fabricated in each of which composition graded layers were provided between layers in a multilayer buffer layer as shown in FIG. 7. Note that the semiconductor base 102 of Experimental Example 3 has substantially the same configuration as that of the semiconductor base 100 of Experimental Example 1, but is different from the semiconductor base 100 of Experimental Example 1 in that: a first composition graded layer 116' is provided between the AlN layer 114 and the GaN layer 115 immediately thereabove; a second composition graded layer 117' is provided between the GaN layer 115 and the AlN layer 114 immediately thereabove; and the second composition graded layer 117' is thicker than the first composition graded layer 116' (see FIG. 7(b)). Here, the degree of the lattice constant changed in the first composition graded layer 116' was larger than that in the second composition graded layer 117', the degree of the lattice constant changed in the second composition graded layer 117' was 0.88%/nm, and both were larger than 0.7%/nm.

Using the semiconductor bases 102 fabricated in Experimental Example 3, the crystallinity and crack length were measured as in Experimental Example 1. Table 1 shows the results. Note that, in the semiconductor bases 102 of Experimental Example 3, cracks were formed in the entire surfaces of the semiconductor bases. Hence, it was impossible to measure the crystallinity by X-ray diffraction, but the crystallinity is presumably quite low.

TABLE 1

| | Epitaxial layer structure Degree of lattice constant changed | Crystallinity: half-value width (arcsec) by X-ray diffraction | Crack length (mm) |
|---|---|---|---|
| Experimental Example 1 | without composition graded layer — | 354 | 7 7 8 |
| Experimental Example 2 | with composition graded layers having the same thickness between layers larger than 0.7%/nm | 650 | 13 15 17 |
| Experimental Example 3 | with composition graded layers between layers, one on the GaN layer was thicker larger than 0.7%/nm | unmeasurable | throughout the entire surface throughout the entire surface throughout the entire surface |

As can be understood from Table 1, when the degrees of the lattice constant changed in the composition graded layers were set larger than 0.7%/nm, the semiconductor bases of Experimental Examples 2, 3 provided with the composition graded layers between the layers in the multilayer buffer layer had lower crystallinity and longer cracks than the semiconductor base of Experimental Example 1 provided with no composition graded layer between the layers in the multilayer buffer layer. Particularly, in Experimental Example 3 where the second composition graded layer 117' was made thicker than the first composition graded layer 116', the crystallinity remarkably deteriorated, and cracks were formed in the entire surfaces.

The above experimental result has revealed that when the composition graded layers are present between the layers in the multilayer buffer layer, if the degrees of the lattice constant changed in the composition graded layers are set larger than 0.7%/nm (i.e., the composition graded layers are thin), the crystallinity deteriorates, and long cracks are formed, decreasing the wafer yield and device yield resulting from fabrication using such a wafer. This has revealed that if the degree of the lattice constant changed in the composition graded layers is set larder than 0.7%/nm, the structure of Patent Document 2 (i,e., multilayer buffer layer structure in which a composition graded layer is provided between a GaN layer and an AlN layer), and a structure of Patent Document 3 (i.e., multilayer buffer layer structure in which composition graded layers are provided between GaN layers and AlN layers, and the composition graded layer between the GaN layer and the AlN layer immediately thereabove has a larger thickness than the composition graded layer between the AlN layer and the GaN layer immediately thereabove) are not applicable.

Hence, the present inventors have earnestly studied a semiconductor base capable of suppressing crystallinity deterioration and crack elongation even when composition graded layers having degrees of the lattice constant changed larger than. 0.7%/nm are provided between layers in a multilayer buffer layer.

As a result, the present inventors have found that when a first composition graded layer provided between a first layer and a second layer immediately thereabove is formed thicker than a second composition graded layer provided between a second layer and a first layer immediately thereabove, a compressive stress can be applied to a channel layer provided on a buffer layer, so that crystal defect in the channel layer can be reduced; in addition, even when the composition graded layers provided between the layers in the multilayer buffer layer have degrees of the lattice constant changed larger than 0.7%/nm, it is possible to suppress crystallinity deterioration and crack elongation. These findings have led to the completion of the present invention.

First, one embodiment of the semiconductor base according to the present invention will be described with reference to FIG. 1.

Figure 1:
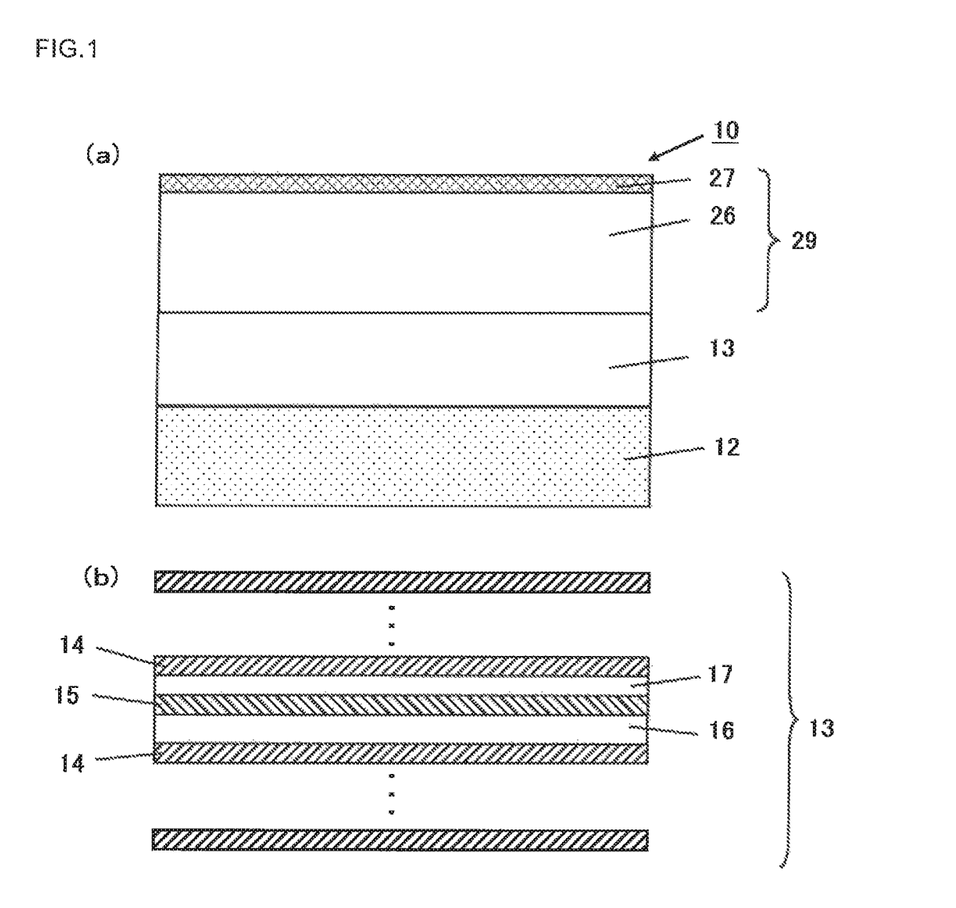
FIG. 1 is a schematic cross-sectional view showing one embodiment of a semiconductor base according to the present invention.

As shown in FIG. 1, a semiconductor base 10 includes: a substrate 12; a buffer layer 13 provided on the substrate 12 and made of a nitride semiconductor; and a channel layer 26 provided on the buffer layer 13 and made of a nitride semiconductor.

The buffer layer 13 contains layers including first layers 14 and second layers 15 alternately provided on each other. The first layers 14 are made of a nitride-based compound semiconductor containing a first material. The second layers 15 are made of a nitride-based compound semiconductor containing a second material having a larger lattice constant than the first material.

The substrate 12 can be, for example, a silicon-based substrate such as a silicon substrate or SiC substrate. The channel layer 26 is made of a nitride-based compound semiconductor containing the second material and can be, for example, a GaN layer.

The buffer layer 13 has a first composition graded layer 16 and a second composition graded layer 17. The first composition graded layer 16 is provided between at least one of the first layers 14 and the second layer 15 immediately thereabove. The first composition graded layer 16 is made of a nitride-based compound semiconductor whose composition ratio of the second material is increased gradually upward and whose composition ratio of the first material is decreased gradually upward. The second composition graded layer 17 is provided between at least one of the second layers 15 and the first layer 14 immediately thereabove. The second composition graded layer 17 is made of a nitride-based compound semiconductor whose composition ratio of the first material is increased gradually upward and whose composition ratio of the second material is decreased gradually upward. The first composition graded layer 16 is thicker than the second composition graded layer 17 (see FIG. 1(b)).

Note that, in the first and second composition graded layers 16, 17, the maximum value of the composition ratio of the first material is equal to or smaller than the composition ratio of the first material in the first layers 14; the maximum value of the composition ratio of the second material is equal to or smaller than the composition ratio of the second material in the second layers 15.

Note that the semiconductor base 10 can further include a barrier layer 27 on the channel layer 26. The channel layer 26 and the barrier layer 27 can form an active layer 29. The barrier layer 27 can be, for example, an AlGaN layer.

As described above, forming the first composition graded layer 16 thicker than the second composition graded layer 17 makes it possible to apply a compressive stress to the channel layer 26 provided on the buffer layer 13. Thereby, crystal defect in the channel layer can be reduced; in addition, even when composition graded layers having degrees of the lattice constant changed larger than 0.7%/nm are provided, crystallinity deterioration and crack elongation can be suppressed.

Here, a presumed mechanism for reducing crystal defect in the channel layer by forming the first composition graded layer thicker than the second composition graded layer will be described below When a second layer having a larger lattice constant (hereinafter, a GaN layer is taken as an example) is grown on a first layer having a smaller lattice constant (hereinafter, an AlN layer is taken as an example), if the first composition graded layer is inserted therebetween such that the first composition graded layer is thicker than the second composition graded layer between a GaN layer and an AlN layer immediately thereabove, the upper GaN layer tends to more coherently grow on the AlN layer (i.e., the GaN layer has a smaller lattice constant on the AlN layer side). This is because a thicker composition graded layer means the degree of the lattice constant changed is smaller (i.e., the lattice constant changes more modestly), so that lattice relaxation due to misfit dislocation is less likely to occur. On the other hand, when an AlN layer is grown on a GaN layer, if the second composition graded layer is inserted therebetween such that the second composition graded layer is thinner than the aforementioned first composition graded layer, the upper AlN layer tends not to coherently grow on the GaN layer (i.e., the lattice constant of the AlN layer is not so large on the GaN layer side). This is because a thinner composition graded layer means the degree of the lattice constant changed is larger (i.e., the lattice constant changes more sharply), so that lattice relaxation due to misfit dislocation is more likely to occur. Hence, a large compressive stress is generated in the GaN layer of the active layer which is provided on the buffer layer. Consequently, it is presumed that crystallinity deterioration and crack elongation in the channel layer can be suppressed.

In contrast when an AlN layer is grown on a GaN layer, if the second composition graded layer is inserted therebetween such that the second composition graded layer is thicker than the first composition graded layer, the upper AlN layer more coherently grows on the GaN layer (i.e., the AlN layer has a larger lattice constant on the GaN layer side). Meanwhile, when the GaN layer is grown on the AlN layer, if the first composition graded layer is inserted therebetween such that the first composition graded layer is thinner than the second composition graded layer, the upper GaN layer tends not to coherently grow on the AlN layer (i.e., the lattice constant of the GaN layer is not so small on the AlN layer side). Hence, when the GaN layer of the active layer which is provided on the buffer layer is grown, the compressive stress is weakened. Consequently, it is presumed that the crystallinity deteriorates and cracks elongate (quality reductions). Presumably, this becomes more remarkable when the degree of the lattice constant changed is large (i.e., the degree of the lattice constant changed is larger than 0.7%/nm).

In the semiconductor base 10, average of composition rates of change in relation to a thickness of the first composition graded layer 16 is preferably smaller than average of composition rates of change in relation to a thickness of the second composition graded layer 17.

With such a relation satisfied between the average of the composition rates of change in the first composition graded layer 16 and the average of the composition rates of change in the second composition graded layer 17, it is possible to effectively suppress crystallinity deterioration and crack elongation in the channel layer 26.

In the semiconductor base 10, preferably, the first composition graded layer 16 is present between every pair of the first layer 14 and the second layer 15 immediately thereabove, and the second composition graded layer 17 is present between every pair of the second layer 15 and the first layer 14 immediately thereabove.

Providing the first composition graded layers 16 and the second composition graded layers 17 as described above makes it possible to surely suppress crystallinity deterioration and crack elongation in the channel layer 26.

In the semiconductor base 10, the first material and the second material can be selected from the group consisting of B, Al, Ga, and In.

Particularly, it is possible to suitably use Al the first material and Ga as the second material.

In the semiconductor base 10, the first layer 14 can be an AlN layer, and the second layer 15 can be a GaN layer.

As the first layer 14 and the second layer 15 constituting the buffer layer 13, those listed above can be suitably used.

When the first layer 14 is an AlN layer and the second layer 15 is a GaN layer, an average of composition rates of change of the first material in the first and second composition graded layers is preferably larger than 29%/nm but not larger than 75%/nm.

When the average of composition rates of change of the first material changed between the first material and the second material in the first and second composition graded layers is larger than 29%/nm, it is possible to form the first and second composition graded layers having smaller thickness, and accordingly shorten the film formation time for the first and second composition graded layers, so that the manufacturing time for the buffer layer can be shortened. As a result, the semiconductor base can be manufactured at low cost.

Moreover, when the average of composition rates of change of the first material changed between the first material and the second material in the first and second composition graded layers is not larger than 75%/nm, it is possible to maintain the effect of suppressing crystallinity deterioration and crack elongation.

Note that the composition rates of change of the first material at an upper surface side in the first composition graded layer and at a lower surface side in the second composition graded layer are more desirably smaller than those at central areas in the first and second composition graded layers. Thereby, it is possible to more effectively suppress crystallinity deterioration and crack elongation.

Next, another embodiment of the semiconductor base according to the present invention will be described with reference to FIG. 2.

Figure 2:
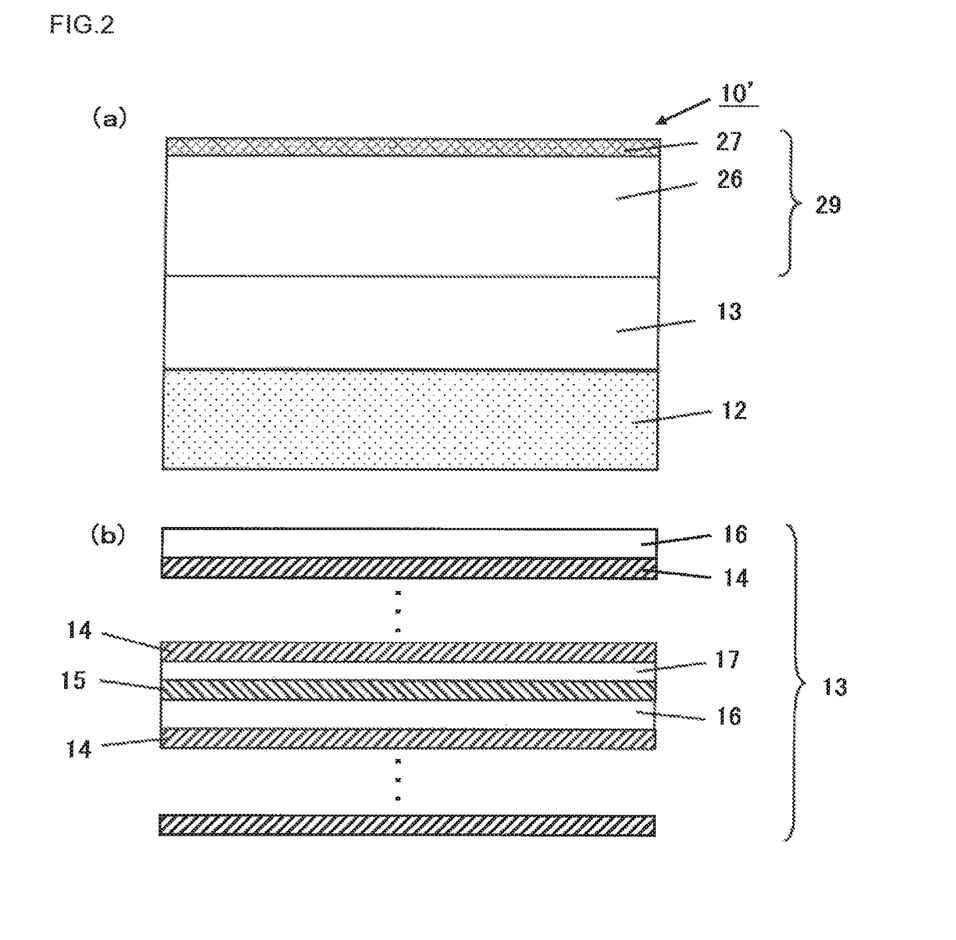
FIG. 2 is a schematic cross-sectional view showing another embodiment of the semiconductor base according to the present invention.

A semiconductor base 10' in FIG. 2 is different from the semiconductor base 10 in FIG. 1 in that: the first composition graded layer 16 is provided as an uppermost layer in the buffer layer 13, and the first layer 14 is provided under the first composition graded layer 16 as the uppermost layer (see FIG. 2(b)).

Constituting the uppermost portion of the buffer layer in this manner increases the compressive stress generated in the channel layer, so that crystallinity deterioration and crack elongation in the channel layer can be suppressed more effectively.

Next, one embodiment of a semiconductor device according to the present invention will be described with reference to FIG. 3.

Figure 3:
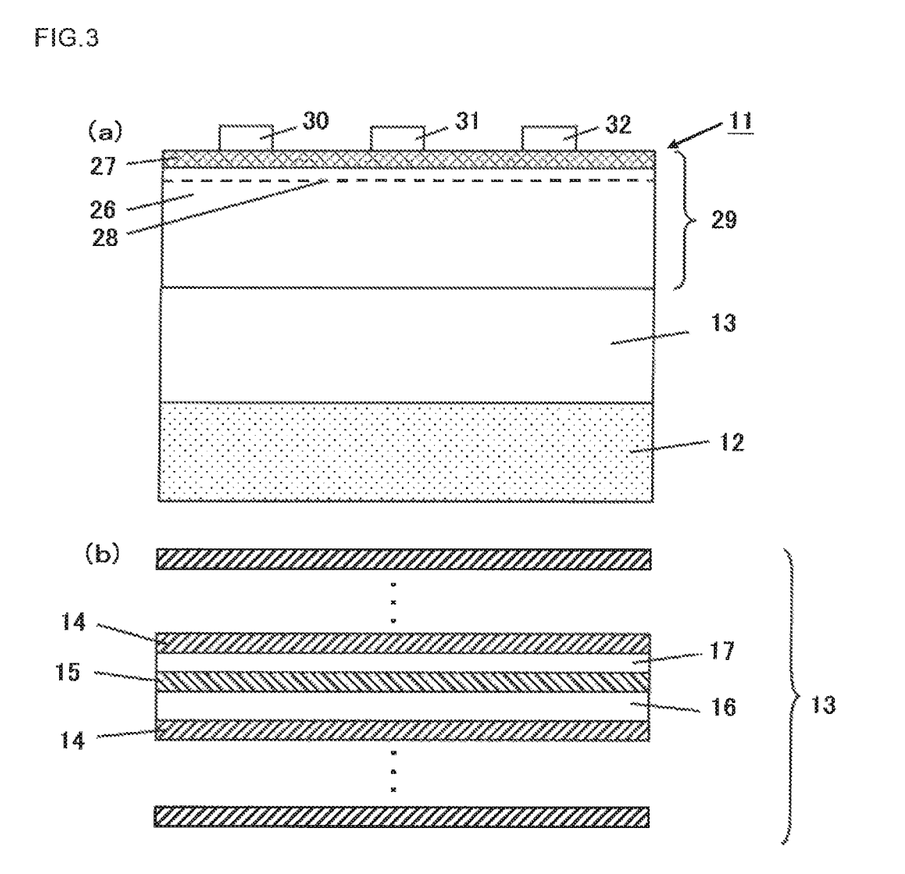
FIG. 3 is a schematic cross-sectional view showing one embodiment of a semiconductor device according to the present invention.

A semiconductor device 11 shown in FIG. 3 includes electrodes (for example, a source electrode 30, a gate electrode a drain electrode 32) provided over the channel layer 26 of the semiconductor base 10 in FIG. 1 through, for example, the barrier layer 27.

In the semiconductor device 11, for example, the source electrode 30 and the drain electrode 32 can be arranged in such a manner that a current flows from the source electrode 30 to the drain electrode 32 via a two-dimensional electron gas 28 formed in the channel layer 26.

The current flowing between the source electrode 30 and the drain electrode 32 can be controlled by utilizing a potential applied to the gate electrode 31.

Such a semiconductor device can be a semiconductor device having less crystallinity deterioration and less crack elongation in the channel layer 26. Thus, it is possible to improve the yield and properties of the semiconductor device.

EXAMPLES

Hereinafter, the present invention will be more specifically described with reference to Examples. However, the present invention is not limited thereto.

Example 1

Figure 4:
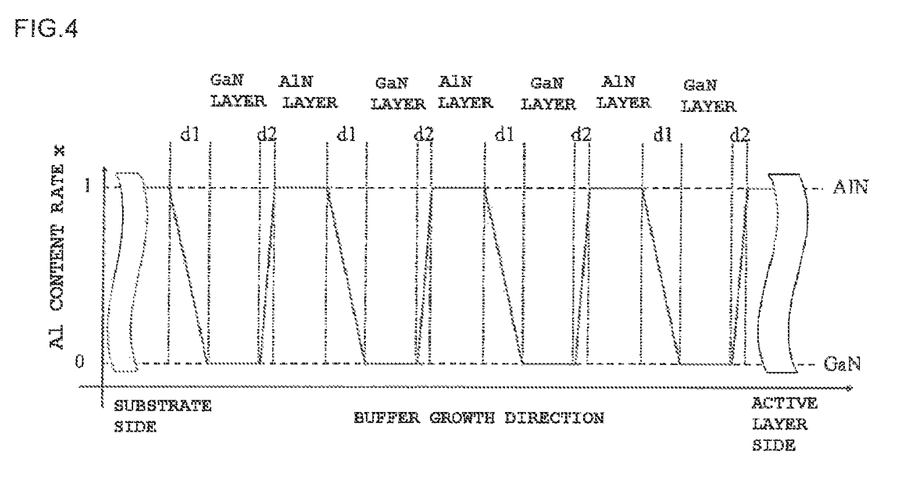
FIG. 4 is a graph showing an aluminum content rate distribution in buffer layers of Examples 1, 2.

Three semiconductor bases 10 as shown in FIG. 1 were fabricated. Note that the substrate 12 was a single-crystal silicon substrate, the channel layer 26 was made of GaN, and the barrier layer 27 was made of AlGaN. Moreover, in the buffer layer 13, the first layer 14 was an AlN layer, and the second layer 15 was a GaN layer. The first composition graded layer 16 and the second composition graded layer 17 each had a composition shown by $Al_xGa_{1-x}N$ ($0 \leq x \leq 1$). The distribution of an Al content rate x in the buffer layer 13 was as shown in FIG. 4. In FIG. 4, d1 represents the thickness of the first composition graded layer 16, and d2 represents the thickness of the second composition graded layer 17, satisfying a relation of d1>d2.

The degree of the lattice constant changed in the first composition graded layer 16 was 0.88%/nm, and the thickness was 2.8 nm. The degree of the lattice constant changed in the second composition graded layer 17 was larger than that in the first composition graded layer 16, the thickness of the second composition graded layer 17 was 0.25 nm or more to less than 2.8 nm, and the degrees of the lattice constant changed were both larger than 0.7%/nm.

Further, the first composition graded layer 16 was provided between every pair of the first layer 1 and the second layer 15 immediately thereabove, and the second composition graded layer was provided between every pair of the second layer 15 and the first layer 14 immediately thereabove.

Using the semiconductor bases fabricated in Example 1, the crystallinity and crack length were measured as in Experimental Example 1. Table 2. shows the results.

Example 2

Three semiconductor bases were fabricated as in Example 1. Nevertheless, the degree of the lattice constant changed in the first composition graded layer 16 was 1.76%/nm, and the thickness was 1.4 nm. The degree of the lattice constant changed in the second composition graded layer 17 was larger than that in the first composition graded layer 16, the thickness of: the second composition graded layer 17 was 0.25 rim or more to less than 1.4 nm, and the degrees of the lattice constant changed were both 1.4%/nm or larger.

Using the semiconductor bases fabricated in Example 2, the crystallinity and crack length were measured as in Experimental Example 1. Table 2 shows the results.

Additionally, the above-described measurement results of Experimental Examples 1 to 3 were also shown again in Table 2 for comparison.

TABLE 2

| | Epitaxial layer structure Degree of lattice constant changed | Crystallinity: half-value width (arcsec) by X-ray diffraction | Crack length (mm) |
|---|---|---|---|
| Example 1 | with composition graded layers between layers, one on the AlN layer was thicker larger than 0.7%/nm | 324 | 5<br>4 |
| Example 2 | with composition graded layers between layers, one on the AlN layer was thicker 1.4%/nm or larger | 311 | 5<br>8<br>8<br>8 |
| Experimental Example 1 | without composition graded layer<br>— | 354 | 7<br>7<br>8 |

TABLE 2-continued

| | Epitaxial layer structure Degree of lattice constant changed | Crystallinity: half-value width (arcsec) by X-ray diffraction | Crack length (mm) |
|---|---|---|---|
| Experimental Example 2 | with composition graded layers having the same thickness between layers | 650 | 13 |
| | | | 15 |
| | larger than 0.7%/nm | | 17 |
| Experimental Example 3 | with composition graded layers between layers, one on the GaN layer was thicker | unmeasurable | throughout the entire surface |
| | | | throughout the entire surface |
| | larger than 0.7%/nm | | throughout the entire surface |

As can be understood from Table 2, in Example 1, the composition graded layers were provided between the layers in the multilayer buffer layer, the first composition graded layer was thicker than the second composition graded layer, and the degrees of the lattice constant changed in the composition graded layers were larger than 0.7%/nm. Example 1 had higher crystallinity and shorter cracks than those in Experimental Example 1 provided with no composition graded layer between the layers in the multilayer buffer layer. Meanwhile, in Example 2, the composition graded layers were provided between the layers in the multilayer buffer layer, the first composition graded layer was thicker than the second composition graded layer, and the degrees of the lattice constant changed in the composition graded layers were 1.4%/nm or larger. Example 2 had higher crystallinity than and equivalent crack lengths to those in Experimental Example 1 provided with no composition graded layer between the layers in the multilayer buffer layer. Particularly, Example 2 where the degrees of the lattice constant changed in the composition graded layers were 1.4%/nm or larger had high crystallinity than Example 1 where the degrees of the lattice constant changed in the composition graded layers were larger than 0.7%/nm.

As described above, it was confirmed that providing the composition graded layers between the layers in the multilayer buffer layer and forming the first composition graded layer thicker than the second composition graded layer make it possible to suppress crystallinity deterioration and crack elongation even when the degrees of the lattice constant changed in the composition graded layers are larger than 0.7%/nm.

It should be noted that the present invention is not limited to the embodiments. The embodiments are illustrative examples, and any example which has substantially the same structure and exerts the same functions and effects as the technical concept described in claims of the present invention is included in the technical scope of the present invention.

The invention claimed is:

1. A semiconductor base comprising:
a silicon-based substrate;
a buffer layer comprising layers including first layers and second layers alternately provided on the silicon-based substrate, the first layers being made of a nitride-based compound semiconductor containing a first material, and the second layers being made of a nitride-based compound semiconductor containing a second material having a larger lattice constant than the first material; and
a channel layer provided on the buffer layer and made of a nitride-based compound semiconductor containing the second material,
wherein the buffer layer further comprises:
a first composition graded layer which is provided between at least one of the first layers and the second layer immediately thereabove, and which is made of a nitride-based compound semiconductor whose composition ratio of the second material is increased gradually upward and whose composition ratio of the first material is decreased gradually upward; and
a second composition graded layer which is provided between at least one of the second layers and the first layer immediately thereabove, and which is made of a nitride-based compound semiconductor whose composition ratio of the first material is increased gradually upward and whose composition ratio of the second material is decreased gradually upward, and
the first composition graded layer is thicker than the second composition graded layer.

2. The semiconductor base according to claim 1, wherein average of composition rates of change in relation to a thickness of the first composition graded layer are smaller than average of composition rates of change in relation to a thickness of the second composition graded layer.

3. The semiconductor base according to claim 1, wherein the first composition graded layer is present between every pair of the first layer and the second layer immediately thereabove, and
the second composition graded layer is present between every pair of the second layer and the first layer immediately thereabove.

4. The semiconductor base according to claim 2, wherein the first composition graded layer is present between every pair of the first layer and the second layer immediately thereabove, and
the second composition graded layer is present between every pair of the second layer and the first layer immediately thereabove.

5. The semiconductor base according to claim 1, wherein the first composition graded layer is provided as an uppermost layer in the buffer layer, and
the first layer is provided under the first composition graded layer.

6. The semiconductor base according to claim 2, wherein the first composition graded layer is provided as an uppermost layer in the buffer layer, and
the first layer is provided under the first composition graded layer.

7. The semiconductor base according to claim 3, wherein the first composition graded layer is provided as an uppermost layer in the buffer layer, and
the first layer is provided under the first composition graded layer.

8. The semiconductor base according to claim 1, wherein the first material and the second material are selected from the group consisting of B, Al, Ga, and In.

9. The semiconductor base according to claim 2, wherein the first material and the second material are selected from the group consisting of B, Al, Ga, and In.

10. The semiconductor base according to claim 3, wherein the first material and the second material are selected from the group consisting of B, Al, Ga, and In.

11. The semiconductor base according to claim 1, wherein
the first layer is an AlN layer, and
the second layer is a GaN layer.

12. The semiconductor base according to claim 2, wherein
the first layer is an AlN layer, and
the second layer is a GaN layer.

13. The semiconductor base according to claim 3, wherein
the first layer is an AlN layer, and
the second layer is a GaN layer.

14. The semiconductor base according to claim 11, wherein an average of composition rates of change of the first material in the first and second composition graded layers is larger than 29%/nm but not larger than 75%/nm.

15. The semiconductor base according to claim 12, wherein an average of composition rates of change of the first material in the first and second composition graded layers is larger than 29%/nm but not larger than 75%/nm.

16. The semiconductor base according to claim 13, wherein an average of composition rates of change of the first material in the first and second composition graded layers is larger than 29%/nm but not larger than 75%/nm.

17. A semiconductor device comprising an electrode on the semiconductor base according to claim 1.

18. A semiconductor device comprising an electrode on the semiconductor base according to claim 2.

19. A semiconductor device comprising an electrode on the semiconductor base according to claim 3.

* * * * *